(12) United States Patent
Funk et al.

(10) Patent No.: US 10,976,347 B2
(45) Date of Patent: Apr. 13, 2021

(54) MAGNET EXTENSION

(71) Applicant: CELADON SYSTEMS, INC., Burnsville, MN (US)

(72) Inventors: William A. Funk, Lakeville, MN (US); Bryan J. Root, Apple Valley, MN (US)

(73) Assignee: CELADON SYSTEMS, INC., Burnsville, MN (US)

( * ) Notice: Subject to any disclaimer, the term of this patent is extended or adjusted under 35 U.S.C. 154(b) by 100 days.

(21) Appl. No.: 16/047,091

(22) Filed: Jul. 27, 2018

(65) Prior Publication Data

US 2019/0033344 A1 Jan. 31, 2019

Related U.S. Application Data

(60) Provisional application No. 62/538,439, filed on Jul. 28, 2017.

(51) Int. Cl.
| | |
|---|---|
| *G01R 1/07* | (2006.01) |
| *G01R 33/02* | (2006.01) |
| *G01R 31/28* | (2006.01) |
| *G01R 1/073* | (2006.01) |
| *G01R 33/00* | (2006.01) |

(52) U.S. Cl.
CPC ........... *G01R 1/07* (2013.01); *G01R 1/07342* (2013.01); *G01R 31/2831* (2013.01); *G01R 33/00* (2013.01); *G01R 33/02* (2013.01)

(58) Field of Classification Search
CPC .. G01R 1/07; G01R 1/07342; G01R 31/2831; G01R 33/00; G01R 33/02; G01L 5/221; G01L 3/104; B62D 6/10; G06F 3/0393; G06F 3/044
USPC .... 324/754.17–755.06, 750.12, 750.21, 500, 324/232–244, 750.04, 762.02, 763.01; 73/862.331–862.338, 862.193, 862.191
See application file for complete search history.

(56) References Cited

U.S. PATENT DOCUMENTS

| | | | | |
|---|---|---|---|---|
| 2002/0174878 | A1* | 11/2002 | Nisson | B01L 3/5085 134/1 |
| 2009/0324451 | A1* | 12/2009 | Yin | B01L 9/523 422/400 |
| 2010/0089187 | A1* | 4/2010 | Yin | G01R 1/06722 73/866.5 |
| 2012/0229129 | A1* | 9/2012 | Kochergin | G01R 33/093 324/244 |

* cited by examiner

*Primary Examiner* — Melissa J Koval
*Assistant Examiner* — Trung Nguyen
(74) *Attorney, Agent, or Firm* — Hamre, Schumann, Mueller & Larson, P.C.

(57) ABSTRACT

A magnet extension, magnetic test assembly, and probe card assembly includes a magnet having a first end and a second end, the first end of the magnet being geometrically configured to provide a selected magnetic field. A resilient member 5 is disposed around the magnet between the first end and the second end. A retaining member is disposed between the first end and the second end. The retaining member surrounds at least a portion of the resilient member.

20 Claims, 4 Drawing Sheets

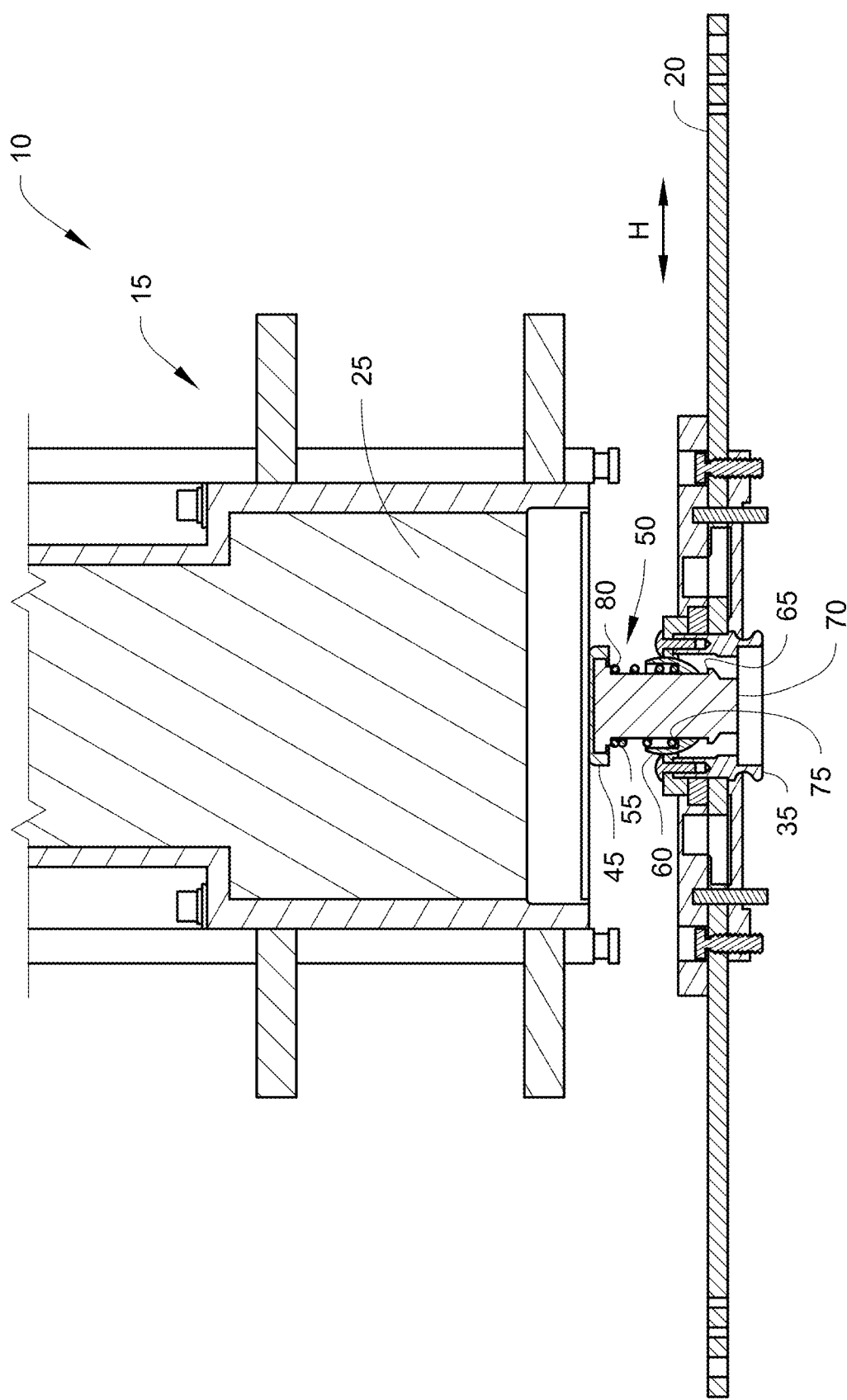

MAGNET EXTENSION

FIELD

This disclosure relates generally to test equipment for a device under test such as, but not limited to, a semiconductor device. More specifically, this disclosure relates to a magnetic test assembly for directing a magnetic field to test a semiconductor device.

BACKGROUND

The semiconductor industry continues to have a need to access many electronic devices on a semiconductor wafer. As the semiconductor industry grows and devices become smaller and more complex, many electrical devices, generally semiconductor devices and on-wafer electrical interconnects, are electrically tested. Some electronic devices utilize a magnetic field. For example, a compass, an accelerometer, and the like, may utilize magnetic fields to function. Often these types of sensors are utilized in, for example, mobile devices (e.g., smartphones, tablets, etc.) and in automobiles. Typically, these may be tested prior to packaging by applying a magnetic field to the sensor. The magnets utilized in this testing are often large and expensive. To control the magnetic field to accomplish the testing, the magnets may be specifically manufactured for a given electronic device. This can result in significant testing costs due to utilizing a particular magnet for each electronic device.

SUMMARY

This disclosure relates generally to test equipment for a device under test such as, but not limited to, a semiconductor device. More specifically, this disclosure relates to a magnetic test assembly for directing a magnetic field to test a semiconductor device.

A magnet extension for a magnetic test assembly is disclosed. The magnet extension includes an extension member having a first end and a second end, the first end of the extension member being geometrically configured to provide a selected magnetic field. A resilient member is disposed around the extension member between the first end and the second end. A retaining member is disposed between the first end and the second end. The retaining member surrounds at least a portion of the resilient member.

A magnetic test assembly is disclosed. The magnetic test assembly includes a magnet and a magnet extension. The magnet extension includes an extension member having a first end and a second end, the first end of the extension member being geometrically configured to provide a selected magnetic field; a resilient member disposed around the magnet between the first end and the second end; and a retaining member disposed between the first end and the second end. The retaining member surrounds at least a portion of the resilient member.

A probe card assembly is disclosed. The probe card assembly includes a probe card having a central core and a magnetic test assembly. The magnetic test assembly includes a magnet and a magnet extension. The magnet extension includes an extension member having a first end and a second end, the first end of the extension member being geometrically configured to provide a selected magnetic field; a resilient member disposed around the extension member between the first end and the second end; and a retaining member disposed between the first end and the second end. The retaining member surrounds at least a portion of the resilient member. The magnet extension is inserted into the central core of the probe card.

A magnet extension for a magnetic test assembly is disclosed. The magnet extension includes an extension member having a first end and a second end, the first end of the extension member being geometrically configured to provide a selected magnetic field. A resilient member is disposed between the first end and the second end. A retaining member is disposed between the first end and the second end. The retaining member contacts the resilient member.

BRIEF DESCRIPTION OF THE DRAWINGS

References are made to the accompanying drawings that form a part of this disclosure and which illustrate embodiments in which the systems and methods described in this specification can be practiced.

FIG. 4 illustrates a sectional view of a probe card assembly including a magnetic test assembly, according to an embodiment.

Like reference numbers represent like parts throughout.

DETAILED DESCRIPTION

This disclosure relates generally to test equipment for a device under test such as, but not limited to, a semiconductor device. More specifically, this disclosure relates to a magnetic test assembly for directing a magnetic field to test a semiconductor device.

When testing a semiconductor device by applying a magnetic field, it can be difficult to arrange a magnet close enough to the semiconductor device (e.g., a semiconductor wafer) to achieve a desired magnetic field density. For example, a probe card is arranged between the magnet and the semiconductor device. Prior solutions have attempted to minimize spacing between the magnet and the semiconductor device by reducing a thickness of the probe card. However, these thin probe cards are custom manufactured and can be a significant expense. Additionally, the reduction of the thickness causes these thin probe cards to be relatively fragile.

Embodiments of this disclosure are directed to a magnet extension that can be utilized with a standard magnet and a standard probe card. The magnet extension can be utilized to bridge the spacing between the magnet and the probe card to achieve the desired magnetic field density near the semiconductor wafer. The magnet extension is a separate piece from the magnet that can be customized to match a particular test need. Because the piece is separate, the piece can be easily swappable such that a single magnet can be utilized for a variety of testing applications. This can, in an embodiment, reduce a cost associated with manufacturing since the relatively expensive component (e.g., the magnet) is not modified to match each testing need. In an embodiment, the magnet itself may be able to be reduced in size as well. In an embodiment, the magnet extension can be utilized with an electromagnet as well. In an embodiment, the magnet extension can be moved independently from the magnet. As a result, the magnetic field may be movable with respect to the device under test over small distances even though the magnet remains stationary.

A "magnet," as used in this specification, includes a permanent magnet or an electromagnet. That is, in an embodiment, the term magnet can refer to a permanent magnet and in another embodiment, the term magnet can refer to an electromagnet.

Figure 1:
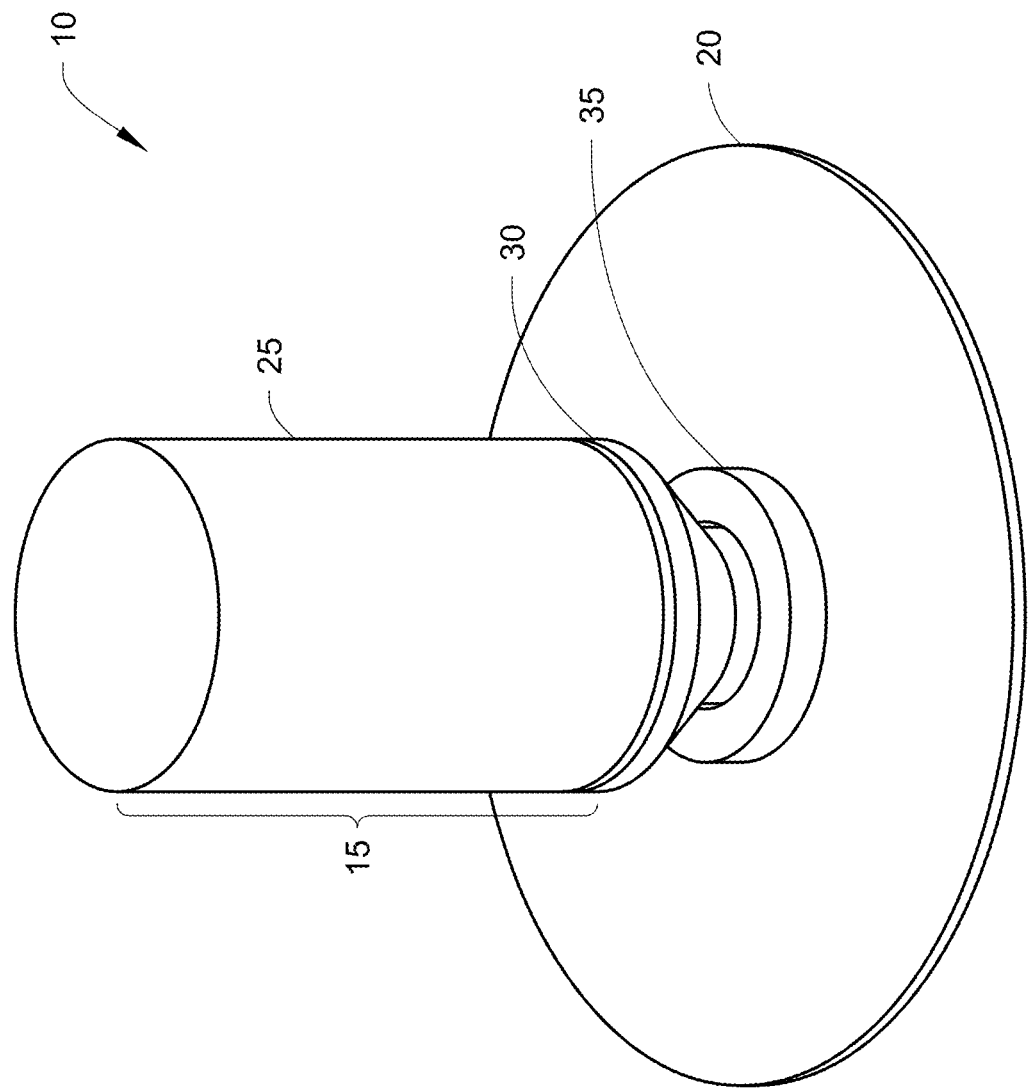
FIG. 1 illustrates a simplified schematic diagram of a probe card assembly including a magnetic test assembly, according to an embodiment.

FIG. 1 illustrates a simplified schematic diagram of a probe card assembly 10 including a magnetic test assembly 15, according to an embodiment. The probe card assembly 10 also includes a probe card 20. The probe card assembly 10 can be used to test a device such as a semiconductor device (not shown). The semiconductor device can include, for example, a semiconductor wafer having one or more components that utilize magnetic fields to function. The probe card assembly 10 including the magnetic test assembly 15 can be used, for example, to test the one or more components of the semiconductor device prior to packaging.

The magnetic test assembly 15 includes a magnet 25 and a magnet extension 30. The magnet 25 can include an electromagnet or a permanent magnet, according to an embodiment. The type of magnet 25 can be determined based on the type of component on the semiconductor device being tested or the type of testing being conducted, according to an embodiment. The magnet 25 can be selected to provide a particular magnetic field for testing the semiconductor device.

The magnet extension 30 is a separate piece from the magnet 25. The magnet extension 30 can alternatively be referred to as a magnet pole extension, magnet tip, magnet applicator, or the like. The magnet extension 30 generally minimizes a distance between a device under test and the magnet 25 so that a desired magnetic field is applied to the device under test. The magnet extension 30 can also be selected to provide a particular magnetic field. In an embodiment, the magnet extension 30 is swappable so that a particular magnetic field can be provided to the semiconductor device without modifying the magnet 25. An embodiment of the magnet extension 30 is shown and described in additional detail in accordance with FIG. 3 below. In an embodiment, the magnet extension 30 can be a ferromagnetic material. In an embodiment, the ferromagnetic material can permit a magnetic field to flow through the material. Geometry of the magnet extension 30 may determine the magnetic field. Examples of suitable ferromagnetic materials can include, for example, iron, nickel, cobalt, and some alloys thereof. In an embodiment, the magnet extension 30 can be a magnet. In an embodiment, the magnet extension 30 can be movable horizontally (in a left-right direction with respect to the figure) relative to the device under test (not shown). The horizontal movement of the magnet extension 30 can be, for example, used to align the magnetic field for testing of the device under test. Additionally, the magnet 25 can be swappable without disturbing the magnet extension 30 and without realigning the magnet 25 prior to further testing.

The probe card 20 includes a central core 35. The magnet extension 30 is insertable into the central core 35. In an embodiment, the magnet extension 30 can be securable in the central core 35. For example, in an embodiment, the magnet extension 30 can have a ball and socket fit with the central core 35. It will be appreciated that the particular connection type can vary based on, for example, the central core 35 of the probe card 20.

Figure 2:
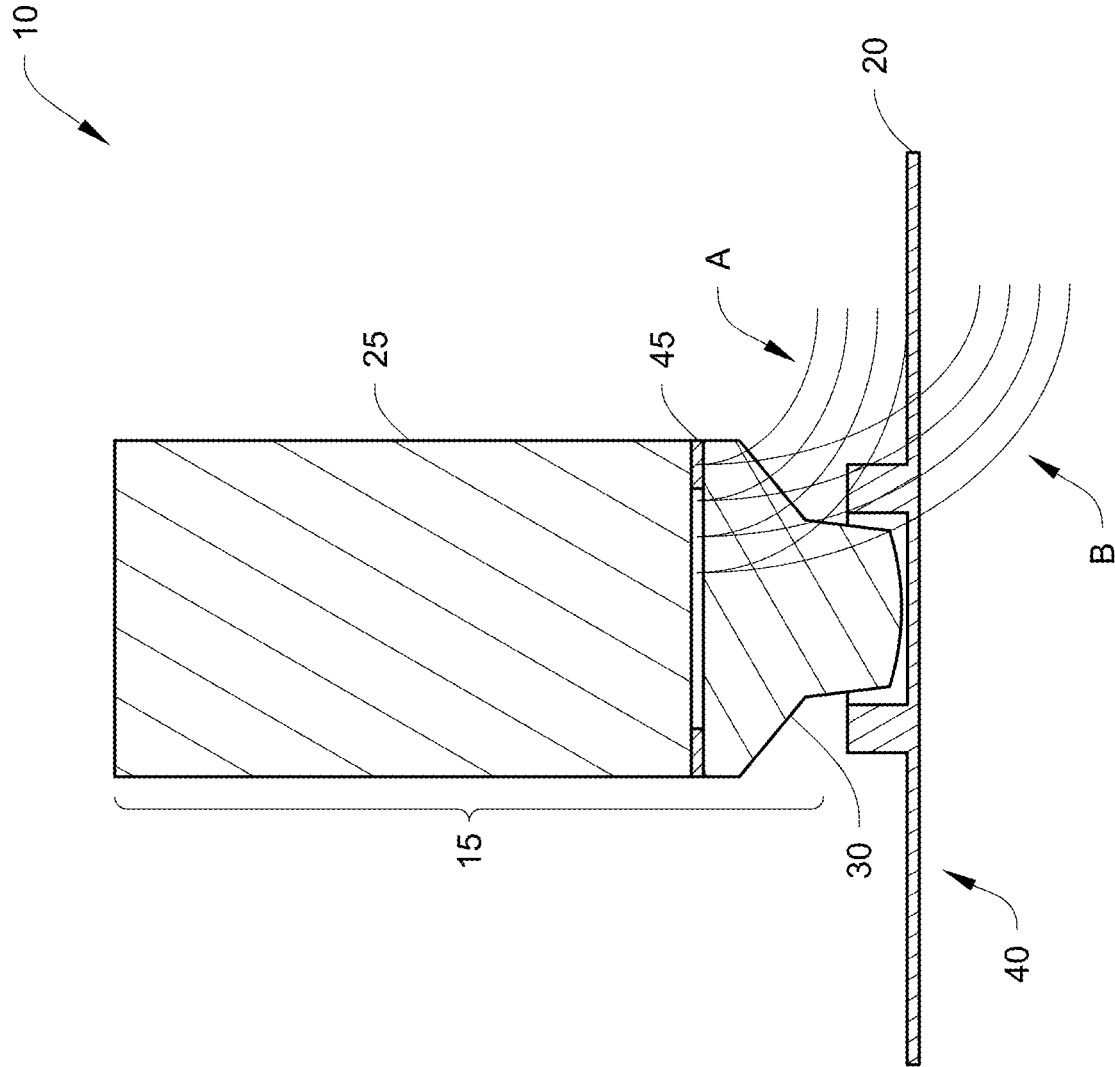
FIG. 2 illustrates a simplified schematic diagram of a section of a probe card assembly including a magnetic test assembly and showing magnetic fields, according to an embodiment.

FIG. 2 illustrates a simplified schematic diagram of the probe card assembly 10 including the magnetic test assembly 15 and showing magnetic fields A and B, according to an embodiment.

The magnetic field A is illustrated to show the magnetic field when the magnet extension 30 is not included. That is, the magnetic field A is provided from the magnet 25. As illustrated, the magnetic field A spreads outward (e.g., from left to right in the figure). As a result, the magnetic field A is relatively less focused on a device side 40 of the probe card assembly 10.

The magnetic field B is illustrated to show the magnetic field when the magnet extension 30 is included. As illustrated, the magnetic field B spreads outward (e.g., from left to right in the figure) at a location that is relatively closer to the device side 40 of the probe card assembly 10 than the magnetic field A. That is, the magnetic field B is relatively more focused on the device side 40 of the probe card assembly 10.

The magnetic test assembly 15, which includes the magnet 25 and the magnet extension 30, also includes a spacer 45. The spacer 45 may be included as part of the magnet extension 30, according to an embodiment.

Figure 3:
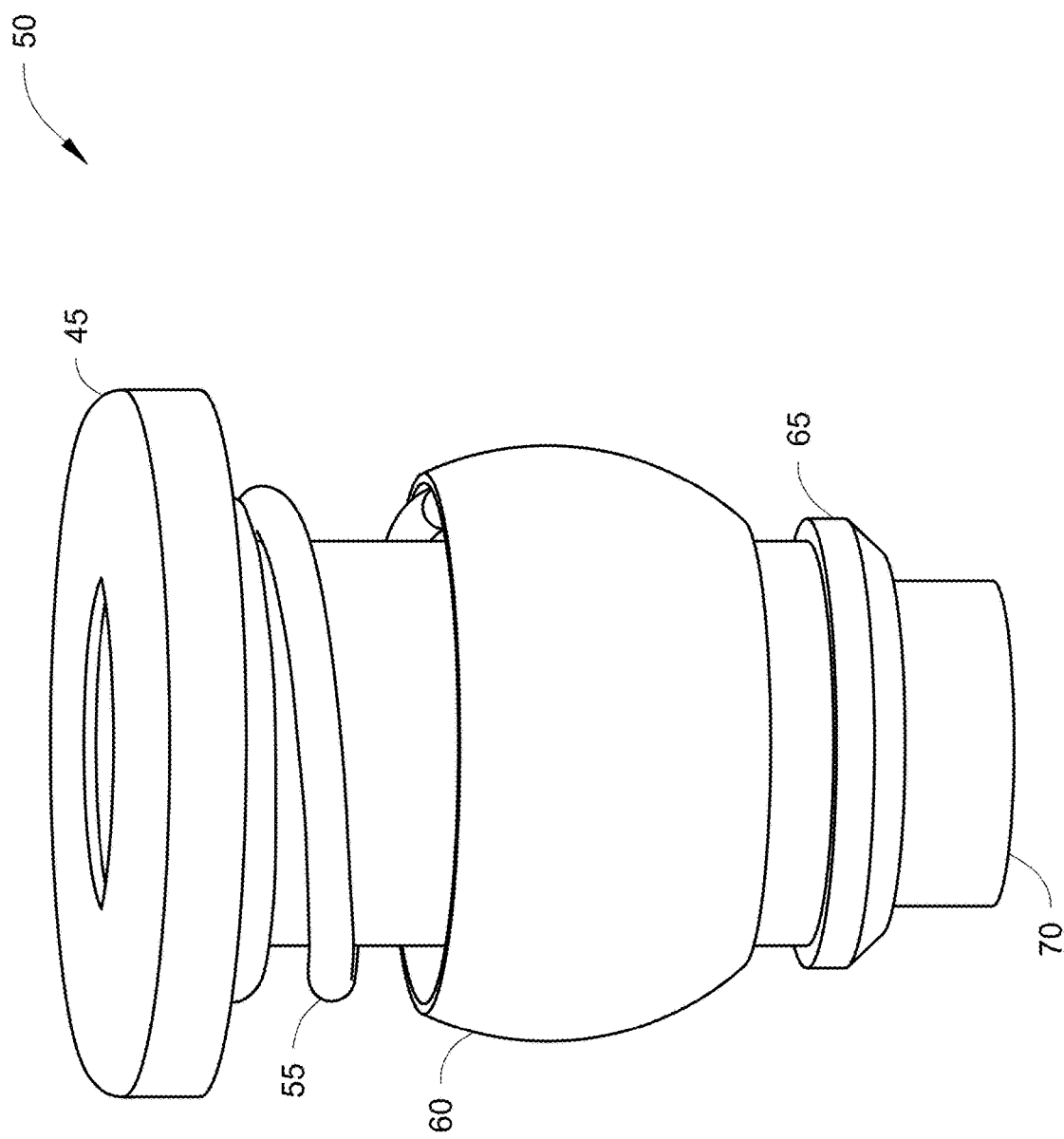
FIG. 3 illustrates a simplified schematic diagram of a magnet extension for a magnetic test assembly, according to an embodiment.

FIG. 3 illustrates a simplified schematic diagram of a magnet extension 50, according to an embodiment. The magnet extension 50 can be utilized as the magnet extension 30 (FIGS. 1 and 2) in the magnetic test assembly 15 (FIGS. 1 and 2). It will be appreciated that the geometry may appear different, but that the geometry of the magnet extension 50 can alternatively match the geometry in FIGS. 1 and 2.

The magnet extension 50 includes the spacer 45, a resilient member 55, a retaining member 60, and an extension member 65. The magnet extension 50 is securable to the probe card 20 (FIG. 1) and to the magnet 25 (FIG. 1). The resilient member 55 can bias the magnet extension 50 toward the magnet 25 to maintain a contact against the magnet 25. The resilient member 55 can, in an embodiment, account for slight variations in sizing of the probe card 20 and the magnet 25. In an embodiment, the resilient member 55 is a spring such as, but not limited to, a coil spring. In an embodiment, the magnet extension 50 may be at or about 1 inch in length. It will be appreciated that the length of the magnet extension 50 is an example and the length of the magnet extension 50 can vary according to the principles described herein. The resilient member 55 can be selected such that a first end is held in place by the spacer 45 and a second end is held in place by the retaining member 60. That is, the resilient member 55 may extend between a surface of the spacer 45 and a surface of the retaining member 60.

The retaining member 60 provides a secure connection between the magnet extension 50 and the central core 35 (FIG. 1) of the probe card 20. In an embodiment, the retaining member 60 is ball shaped to provide a ball and socket type connection between the magnet extension 50 and the central core 35 of the probe card 20. The retaining member 60 can be made of an electrically insulative material. In an embodiment, the retaining member 60 can be made of a thermally insulative material. An example of a suitable material for the retaining member 60 includes, but is not limited to, a polytetrafluoroethylene (PTFE) such as, but not limited to, Teflon® which is commercially available from the Chemours Company. In an embodiment, the retaining member 60 is ball shaped and has a diameter of at or about 0.625 inches. It will be appreciated that the diameter is an example and the diameter of the retaining member 60 can vary according to the principles described herein. For example, in an embodiment, a size of the diameter may be selected to, for example, correspond to a size of the central core 35 (FIG. 1) of the probe card 20 (FIG. 1).

The spacer 45 can be made of an insulative material. The insulative material can be electrically insulative, according to an embodiment. The insulative material can be thermally insulative, according to an embodiment. The insulative material can be both electrically and thermally insulative, according to an embodiment. The spacer 45 can be colored. The coloring of the spacer 45 can be, for example, used to identify variations between a plurality of magnet extensions. For example, the spacer 45 can be red to indicate a first configuration of the magnet extension 50 and yellow to indicate a second configuration of the magnet extension 50. It will be appreciated that red and yellow are selected as examples and are not intended to be limiting. The selected color can vary according to principles described in this specification. It will further be appreciated that other means of coding the magnet extension 50 can be selected.

The variation of the configuration of the magnet extension 50 can be determined based on the extension member 65 of the magnet extension 50. The extension member 65 can be designed to have a particular geometry at a tip 70 of the extension member 65. In an embodiment, the geometry can be selected based on a mathematical modeling of the magnetic field that is desired. The tip 70 of the extension member 65 can be modified according to a particular application. The extension member 65 can generally be arranged such that the poles of the magnet are arranged oppositely from the poles of the magnet 25 (FIG. 1). For example, if a north pole of magnet 25 is facing toward the semiconductor device, then a south pole of the extension member 65 would face toward the magnet 25 and a north pole of the extension member 65 would face the semiconductor device. This arrangement can, for example, utilize a magnetic attraction between the magnet 25 and the extension member 65 to hold the magnet 25 and the extension member 65 together. In an embodiment, the extension member 65 can have a length of at or about 0.75 inches. It will be appreciated that the length of the extension member 65 is an example and that the length of the extension member 65 can vary according to the principles described herein.

FIG. 4 illustrates a sectional view of the probe card assembly 10 including the magnetic test assembly 15, according to an embodiment. Features of FIG. 4 can be the same as or similar to features of FIGS. 1-3. Features of FIG. 4 which have been previously described will not be described in additional detail. FIG. 4 additionally shows that the magnet extension 50 as part of the magnetic test assembly 15.

As illustrated in FIG. 4, the resilient member 55 can provide a force in a vertical direction (with respect to the page in FIG. 4) so that the magnet extension 50 can move relative to the probe card 20. A first stop 75 and a second stop 80 can be provided to maintain the resilient member 55. In the illustrated embodiment, the first stop 75 can be a surface in an interior of the retaining member 60. The second stop 80 can be a surface on a bottom side of the spacer 45. It will be appreciated that the second stop 80 can alternatively be a protrusion extending horizontally from the magnet extension 50.

Aspects:

It is noted that any one of aspects 1-10 can be combined with any one of aspects 11-21, any one of aspects 22-30, and/or any one of aspects 31-40.

Aspect 1. A magnet extension for a magnetic test assembly, comprising:
an extension member having a first end and a second end, the first end of the extension member being geometrically configured to provide a selected magnetic field;
a resilient member disposed around the extension member between the first end and the second end; and
a retaining member disposed between the first end and the second end, wherein the retaining member surrounds at least a portion of the resilient member.

Aspect 2. The magnet extension according to aspect 1, wherein the resilient member is a spring.

Aspect 3. The magnet extension according to one of aspects 1 or 2, further comprising a spacer.

Aspect 4. The magnet extension according to aspect 3, wherein the spacer is color coded to identify a geometry of the extension member.

Aspect 5. The magnet extension according to any one of aspects 3 or 4, wherein the spacer is one or more of thermally insulating and electrically insulating.

Aspect 6. The magnet extension according to any one of aspects 1-5, wherein the retaining member is ball shaped.

Aspect 7. The magnet extension according to any one of aspects 1-6, wherein the retaining member is one or more of thermally insulating and electrically insulating.

Aspect 8. The magnet extension according to any one of aspects 1-7, wherein the retaining member is made of polytetrafluoroethylene (PTFE).

Aspect 9. The magnet extension according to any one of aspects 1-8, wherein the extension member is a magnet.

Aspect 10. The magnet extension member according to any one of aspects 1-8, wherein the extension member is made of a ferromagnetic material.

Aspect 11. A magnetic test assembly, comprising:
a magnet; and
a magnet extension, including:
an extension member having a first end and a second end, the first end of the extension member being geometrically configured to provide a selected magnetic field;
a resilient member disposed around the extension member between the first end and the second end; and
a retaining member disposed between the first end and the second end, wherein the retaining member surrounds at least a portion of the resilient member.

Aspect 12. The magnetic test assembly according to aspect 11, wherein the magnet is one of a permanent magnet and an electromagnet.

Aspect 13. The magnetic test assembly according to aspect 12, wherein the resilient member is a spring.

Aspect 14. The magnetic test assembly according to one of aspects 12 or 13, further comprising a spacer.

Aspect 15. The magnetic test assembly according to aspect 14, wherein the spacer is color coded to identify a geometry of the extension member.

Aspect 16. The magnetic test assembly according to any one of aspects 14 or 15, wherein the spacer is one or more of thermally insulating and electrically insulating.

Aspect 17. The magnetic test assembly according to any one of aspects 11-16, wherein the retaining member is ball shaped.

Aspect 18. The magnetic test assembly according to any one of aspects 11-17, wherein the retaining member is one or more of thermally insulating and electrically insulating.

Aspect 19. The magnetic test assembly according to any one of aspects 11-18, wherein the retaining member is made of polytetrafluoroethylene (PTFE).

Aspect 20. The magnetic test assembly according to any one of aspects 11-19, wherein the extension member is a magnet.

Aspect 21. The magnetic test assembly according to any one of aspects 11-19, wherein the extension member is made of a ferromagnetic material.

Aspect 22. A probe card assembly, comprising:
a probe card having a central core; and
a magnetic test assembly, including:
  a magnet; and
  a magnet extension, including:
    an extension member having a first end and a second end, the first end of the extension member being geometrically configured to provide a selected magnetic field;
    a resilient member disposed around the extension member between the first end and the second end; and
    a retaining member disposed between the first end and the second end,
  wherein the retaining member surrounds at least a portion of the resilient member,
wherein the magnet extension is inserted into the central core of the probe card.

Aspect 23. The probe card assembly according to aspect 22, wherein the magnet is one of a permanent magnet and an electromagnet.

Aspect 24. The probe card assembly according to aspect 23, wherein the resilient member is a spring.

Aspect 25. The probe card assembly according to one of aspects 23 or 24, further comprising a spacer.

Aspect 26. The probe card assembly according to aspect 25, wherein the spacer is color coded to identify a geometry of the extension member.

Aspect 27. The probe card assembly according to any one of aspects 25 or 26, wherein the spacer is one or more of thermally insulating and electrically insulating.

Aspect 28. The probe card assembly according to any one of aspects 22-27, wherein the retaining member is ball shaped.

Aspect 29. The probe card assembly according to any one of aspects 22-28, wherein the retaining member is one or more of thermally insulating and electrically insulating.

Aspect 30. The probe card assembly according to any one of aspects 22-29, wherein the retaining member is made of polytetrafluoroethylene (PTFE).

Aspect 31. A magnet extension for a magnetic test assembly, comprising:
an extension member having a first end and a second end, the first end of the extension member being geometrically configured to provide a selected magnetic field;
a resilient member disposed between the first end and the second end; and
a retaining member disposed between the first end and the second end, wherein the retaining member contacts the resilient member.

Aspect 32. The magnet extension according to aspect 31, wherein the resilient member is a spring.

Aspect 33. The magnet extension according to one of aspects 31 or 32, further comprising a spacer, the spacer contacting the resilient member.

Aspect 34. The magnet extension according to aspect 33, wherein the spacer is color coded to identify a geometry of the magnet.

Aspect 35. The magnet extension according to any one of aspects 33 or 34, wherein the spacer is one or more of thermally insulating and electrically insulating.

Aspect 36. The magnet extension according to any one of aspects 31-35, wherein the retaining member is ball shaped.

Aspect 37. The magnet extension according to any one of aspects 31-36, wherein the retaining member is one or more of thermally insulating and electrically insulating.

Aspect 38. The magnet extension according to any one of aspects 31-37, wherein the retaining member is made of polytetrafluoroethylene (PTFE).

Aspect 39. The magnet extension according to any one of aspects 31-38, wherein the extension member is a magnet.

Aspect 40. The magnet extension according to any one of aspects 31-38, wherein the extension member is made of a ferromagnetic material.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

Semiconductor Device Not Limitative

The present disclosure is particularly suitable for probing semiconductor devices, but the use of the present teachings is not limited to probing semiconductor devices. Other devices may be applied to the present invention teachings. Thus, while this specification speaks in terms of probing "semiconductor" devices, this term should be interpreted broadly to include probing any suitable device.

What is claimed is:

1. A magnet extension for a magnetic test assembly, comprising:
  a magnetic extension member having a first end and a second end, the first end of the magnetic extension member being geometrically configured to provide a selected magnetic field;
  a resilient member configured to bias the magnet extension toward a magnet to maintain a contact against the magnet, the resilient member being disposed around the magnetic extension member between the first end and the second end of the magnetic extension member; and
  a retaining member disposed between the first end and the second end of the magnetic extension member, wherein the retaining member surrounds at least a portion of the resilient member.

2. The magnet extension according to claim 1, wherein the resilient member is a spring.

3. The magnet extension according to claim 1, further comprising a spacer, the spacer being one or more of thermally insulating and electrically insulating,
  wherein a first end of the resilient member is held in place by the spacer, and a second end of the resilient member is held in place by the retaining member.

4. The magnet extension according to claim 3, wherein the spacer is color coded to identify a geometry of the magnetic extension member.

5. The magnet extension according to claim 1, wherein the retaining member is ball shaped and the retaining member is one or more of thermally insulating and electrically insulating.

6. The magnet extension according to claim 1, wherein the retaining member is made of polytetrafluoroethylene (PTFE).

7. The magnet extension according to claim 1, wherein the magnetic extension member is a magnet or is made of a ferromagnetic material.

8. A magnetic test assembly, comprising:
a magnet; and
a magnet extension, including:
  a magnetic extension member having a first end and a second end, the first end of the magnetic extension member being geometrically configured to provide a selected magnetic field;
  a resilient member disposed around the magnetic extension member between the first end and the second end; and
  a retaining member disposed between the first end and the second end, wherein the retaining member surrounds at least a portion of the resilient member,
wherein the magnetic extension member extends from the magnet in an axial direction of the magnet.

9. The magnetic test assembly according to claim 8, wherein the magnet is one of a permanent magnet and an electromagnet.

10. A probe card assembly, comprising:
a probe card having a central core; and
a magnetic test assembly, including:
  a magnet; and
  a magnet extension, including:
    a magnetic extension member having a first end and a second end, the first end of the magnetic extension member being geometrically configured to provide a selected magnetic field;
    a resilient member configured to bias the magnet extension toward the magnet to maintain a contact against the magnet, the resilient member being disposed around the magnetic extension member between the first end and the second end of the magnetic extension member; and
    a retaining member disposed between the first end and the second end of the magnetic extension member, wherein the retaining member surrounds at least a portion of the resilient member,
  wherein the magnet extension is inserted into the central core of the probe card,
  wherein the magnetic extension member extends from the magnet in an axial direction of the magnet.

11. The probe card assembly according to claim 10, wherein the magnet is one of a permanent magnet and an electromagnet.

12. The probe card assembly according to claim 10, wherein the resilient member is a spring.

13. The probe card assembly according to claim 10, further comprising a spacer, wherein a first end of the resilient member is held in place by the spacer, and a second end of the resilient member is held in place by the retaining member.

14. The probe card assembly according to claim 13, wherein the spacer is color coded to identify a geometry of the magnetic extension member.

15. The probe card assembly according to claim 13, wherein the spacer is one or more of thermally insulating and electrically insulating.

16. The probe card assembly according to claim 10, wherein the retaining member is ball shaped.

17. The probe card assembly according to claim 10, wherein the retaining member is one or more of thermally insulating and electrically insulating, or is made of polytetrafluoroethylene (PTFE).

18. The magnet extension according to claim 1, wherein at least a second portion of the resilient member is not surrounded by the retaining member.

19. The magnet extension according to claim 1, further comprising:
a first stop and a second stop provided to maintain the resilient member,
wherein the first stop is a surface in an interior of the retaining member, and the second stop is a surface on a bottom side of a spacer.

20. The probe card assembly according to claim 10, wherein the magnetic extension member is arranged such that poles of the magnetic extension member are arranged oppositely from poles of the magnet.

* * * * *